(12) United States Patent
Kim

(10) Patent No.: US 8,629,964 B2
(45) Date of Patent: Jan. 14, 2014

(54) FLAT PANEL DISPLAY

(75) Inventor: Min-Cheol Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 640 days.

(21) Appl. No.: 12/656,706

(22) Filed: Feb. 12, 2010

(65) Prior Publication Data

US 2011/0063272 A1 Mar. 17, 2011

(30) Foreign Application Priority Data

Sep. 15, 2009 (KR) ........................ 10-2009-0086923

(51) Int. Cl.
*G02F 1/1345* (2006.01)

(52) U.S. Cl.
USPC ............. 349/150; 349/59; 349/149; 349/151; 349/152

(58) Field of Classification Search
None
See application file for complete search history.

(56) References Cited

U.S. PATENT DOCUMENTS

| | | | |
|---|---|---|---|
| 6,532,055 B2 * | 3/2003 | Oishi | 349/149 |
| 6,919,678 B2 * | 7/2005 | Ozolins et al. | 313/479 |
| 2001/0005254 A1 | 6/2001 | Oishi | |
| 2003/0031001 A1 * | 2/2003 | Chu | 361/784 |
| 2004/0041504 A1 | 3/2004 | Ozolins et al. | |
| 2005/0078059 A1 * | 4/2005 | Kim | 345/60 |
| 2005/0099106 A1 | 5/2005 | Kim et al. | |
| 2005/0117285 A1 | 6/2005 | Bang et al. | |
| 2006/0082273 A1 | 4/2006 | Kim et al. | |
| 2006/0098412 A1 | 5/2006 | Kim et al. | |
| 2006/0197718 A1 * | 9/2006 | Yamate | 345/37 |
| 2007/0058124 A1 * | 3/2007 | Chen | 349/149 |
| 2007/0284763 A1 * | 12/2007 | Kim et al. | 257/797 |
| 2008/0083527 A1 | 4/2008 | Horng et al. | |
| 2008/0123016 A1 | 5/2008 | Kwak et al. | |
| 2008/0136746 A1 | 6/2008 | Kong et al. | |
| 2009/0096952 A1 | 4/2009 | Yeo | |
| 2009/0184899 A1 | 7/2009 | Kim et al. | |

FOREIGN PATENT DOCUMENTS

| | | |
|---|---|---|
| CN | 1615073 | 5/2005 |
| CN | 1774163 | 5/2006 |
| CN | 101409031 | 4/2009 |
| JP | 2-165512 A | 6/1990 |
| JP | 02165512 | 6/1990 |
| JP | 2000112392 | 4/2000 |
| JP | 2002-261484 | 9/2002 |
| JP | 2005-326757 A | 11/2005 |
| JP | 2005326757 | 11/2005 |

(Continued)

OTHER PUBLICATIONS

U.S. Appl. No. 12/656,707, filed Feb. 12, 2010, Min-Cheol Kim.

(Continued)

*Primary Examiner* — Bumsuk Won
*Assistant Examiner* — Ryan Crockett
(74) *Attorney, Agent, or Firm* — Robert E. Bushnell, Esq.

(57) ABSTRACT

A flat panel display (FPD) has a conductive heat proof plate inserted into the back surface of a display panel on which printed circuit boards (PCBs) and signal lines are formed. The signal lines are surrounded by a blocking unit, and the external surface of the blocking unit is made of a conductive material to be electrically coupled to the heat proof plate so that resistance against electromagnetic compatibility (EMC) of a large flat panel display is improved and a thermal characteristic is improved.

18 Claims, 3 Drawing Sheets

(56) References Cited

FOREIGN PATENT DOCUMENTS

| JP | 2006-195177 A | 7/2006 |
|---|---|---|
| JP | 2007-147910 A | 6/2007 |
| JP | 4153951 B2 | 7/2008 |
| JP | 2009-169374 A | 7/2009 |
| JP | 2009169374 | 7/2009 |
| KR | 101998040876 A | 8/1998 |
| KR | 10-2001-0049113 | 6/2001 |
| KR | 10-2002-0046823 | 6/2002 |
| KR | 1020060061938 A | 6/2006 |
| KR | 10-2006-0111077 | 10/2006 |
| KR | 10-2006-0131313 | 12/2006 |
| KR | 1020070020610 A | 2/2007 |
| KR | 10-2007-0097200 | 10/2007 |
| KR | 10-2008-0044962 A | 5/2008 |
| TW | I245242 B | 12/2005 |
| TW | I302590 B | 4/2008 |

OTHER PUBLICATIONS

Japanese Office Action dated Nov. 15, 2011 of the Japanese Patent Application No. 2009-281803 which claims Korean Patent Application No. 10-2009-0086923. With its English translation.

Korean Notice of Allowance dated Oct. 31, 2011 of the Korean Patent Application No. 10-2009-0086923. With its English translation.

Korean Notice of Allowance dated Jul. 27, 2011 of the Korean Patent Application No. 10-2009-0086924 (Cited in the corresponding cross-referenced Information Disclosure Statement, U.S. Appl. No. 12/656,707, filed Oct. 25, 2011.) With its English translation.

Korean Office Action dated Mar. 4, 2011 of the Korean Patent Application No. 10-2009-0086924 (Cited in the corresponding cross-referenced Information Disclosure Statement U.S. Appl. No. 12/656,707, filed Apr. 11, 2011.) With its English translation.

Korean Office Action dated Mar. 16, 2011 of the Korean Patent Application No. 10-2009-0086923. With its English translation.

German Office Action dated Dec. 10, 2012 of the Germany Patent Application No. 102010040693.7 which claims Korean Patent Application No. 10-2009-0086923. With its English translation.

Cited in Chinese Office Action dated Jan. 22, 2013 issued by SIPO in connection with 201010180565.4 and also which claims Korean Patent application 10-2009-0086923 with Request for Entry of the accompanying Office Action.

Taiwanese Office Action issued by Taiwanese Patent Office on Jun. 17, 2013 corresponding to KR10-2009-0086923.

\* cited by examiner

FLAT PANEL DISPLAY

CROSS-REFERENCE TO RELATED APPLICATIONS

This application makes reference to, incorporates the same herein, and claims all benefits accruing under 35 U.S.C. §119 from an application entitled FLAT PANEL DISPLAY earlier filed in the Korean Intellectual Property Office on Sep. 15, 2009 and there duly assigned Ser. No. 10-2009-0086923. Furthermore, the present application is related to a co-pending U.S. applications, Ser. No. 12/656,707, entitled Flat Panel Displays, based upon Korean Patent Application Serial No.10-2009-0086924 filed in the Korean Intellectual Property Office on Sep. 15, 2009, and filed in the U.S. Patent & Trademark Office concurrently with the present application.

BACKGROUND OF THE INVENTION

1. Field of the Invention

The present invention relates to a flat panel display (FPD), and more particularly, to a flat panel display capable of effectively dispersing the heat generated by a panel, and a printed circuit board (PCB) to improve resistance against electromagnetic compatibility (EMC).

2. Description of the Related Art

A flat panel display (FPD) is divided into an emission type flat panel display, such as an organic light emitting display (OLED), and a plasma display panel (PDP) and a non-emission type flat panel display which does not emit light like a liquid crystal display (LCD).

The flat panel display includes a display panel for displaying an image, a driver for providing a predetermined signal to the pixels provided in the display panel, and a controller for controlling the driver.

In this regard, the driver and the controller are mounted on printed circuit boards (PCBs) and the printed circuit boards are provided on the back surface of the display panel.

The printed circuit board on which the driver is mounted and the printed circuit board on which the controller is mounted are positioned on the opposite surface, that is, the back surface of the display panel for displaying an image. A plurality of signal lines for transmitting and receiving signals between the driver and the controller are formed between the printed circuit board on which the driver is mounted and the printed circuit board on which the controller is mounted. The printed circuit boards and the signals lines are fixed to the back surface of the display panel by an adhesive tape.

In the case of the flat panel display having the above structure, harmful radio waves are generated by the printed circuit boards, various elements mounted on the printed circuit boards, and the signal lines coupled between the printed circuit boards. The generation of such radio waves is severely restricted.

Among the restricted harmful radio waves, when electromagnetic waves are taken as an example, it is determined that the electromagnetic waves have electromagnetic compatibility (EMC) for testing whether the electromagnetic waves are suitable for an environment, electromagnetic interference (EMI) which may be a cause of interference no less than a predetermined level against an external apparatus in the electromagnetic compatibility, and electromagnetic susceptibility (EMS) which may disturb the operation of a corresponding apparatus by external electromagnetic waves.

Therefore, the electromagnetic interference noise unnecessarily generated by the flat panel display is reduced as much as possible, and the electromagnetic susceptibility is reduced against the external electromagnetic wave environment to enhance the resistance against the electromagnetic waves of the flat panel display and to improve the resistance against the electromagnetic compatibility.

However, recently as the flat panel display is enlarged, the distance between the printed circuit boards coupled by signal lines increases so that the length of the signal lines increases. In this case, the flat panel display is vulnerable to electromagnetic interference noise. As a result, the resistance against the electromagnetic compatibility of the large flat panel display deteriorates.

In addition, in the case of the flat panel display having the above structure, since the printed circuit boards are directly attached on the back surface of the display panel by the adhesive tape, a path which can effectively disperse the heat generated by the display panel and the heat generated by the printed circuit board is not formed so that, when the flat panel display operates for a long time, the flat panel display is vulnerable to the heat.

SUMMARY OF THE INVENTION

Accordingly, the present invention has been developed to provide a flat panel display (FPD) in which a conductive heat proof plate is inserted into the back surface of a display panel on which printed circuit boards (PCB) and signal lines are formed, the signal lines are surrounded by a blocking unit, and the external surface of the blocking unit is made of a conductive material to be electrically coupled to the heat proof plate so that resistance against electromagnetic compatibility of a large flat panel display is improved and a thermal characteristic is improved.

In order to achieve the foregoing and/or other aspects of the present invention, an embodiment of the present invention provides a flat panel display (FPD) comprising a display panel including a plurality of pixels for displaying an image, a scan driver and a data driver for providing scan signals and data signals to the pixels included in the display panel, a timing controller for applying a predetermined control signal to the scan driver and the data driver so as to control the scan driver and the data driver, a first printed circuit board (PCB) and a second printed circuit board electrically coupled to the scan driver and the data driver, a third printed circuit board on which the timing controller is mounted, a plurality of signal lines for transmitting signals between the timing controller and the scan and data drivers respectively mounted on the third printed circuit board and the first and second printed circuit boards, a heat proof plate inserted between a back surface of the display panel and the first to third printed circuit boards, and a blocking unit formed to surround the plurality of signal lines.

The scan driver and the data driver are formed of a plurality of integrated circuits (ICs). The plurality of ICs which constitute the scan driver are formed on one outline of a display panel that displays the image. The plurality of ICs which constitute the data driver are mounted on flexible printed circuit boards (FPCBs). The flexible printed circuit boards are coupled to the second printed circuit board.

The heat proof plate is made of a material having high electrical and thermal conductivity. An external surface of the heat proof plate is made of an adhesive material.

The heat proof plate is made of a material having a color with high reflectance. A ground power source is applied to the heat proof plate.

The blocking unit is formed of an insulating layer formed in a region that contacts the signal lines and a conductive material that surrounds an external surface of the insulating layer. The external surface of the blocking unit having conductivity contacts the heat proof plate to be electrically coupled.

According to the present invention, the conductive heat proof plate is inserted onto the back surface of a display panel on which the printed circuit boards and the signal lines are formed, the signal lines are surrounded by a blocking unit, and the external surface of the blocking unit is made of a conductive material to be electrically coupled to the heat proof plate to improve the resistance against the electromagnetic compatibility of the large flat panel display and to improve the thermal characteristic.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
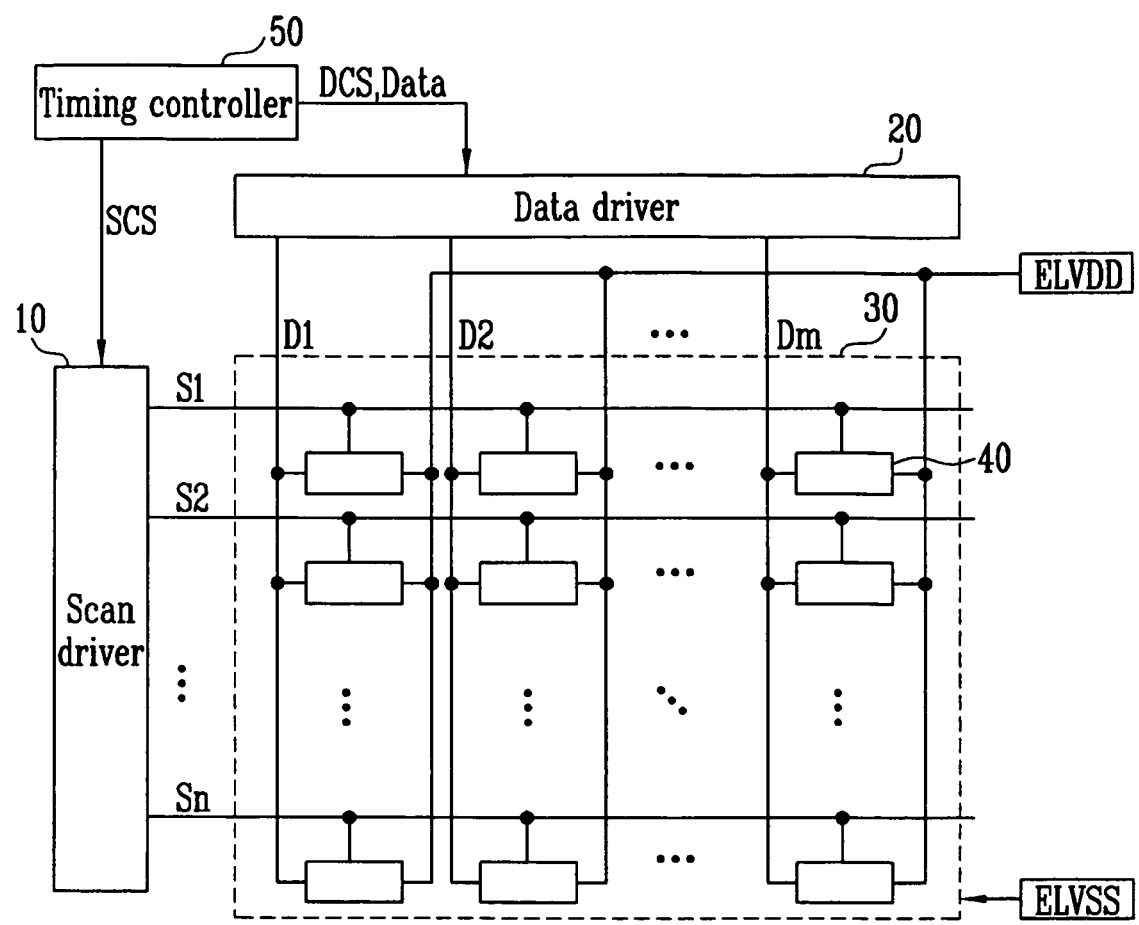
FIG. 1 is a block diagram illustrating components of a flat panel display (FPD) according to an embodiment of the present invention.

In the following detailed description, only certain exemplary embodiments of the present invention have been shown and described, simply by way of illustration. As those skilled in the art will realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on another element or be indirectly on another element with one or more intervening elements interposed therebetween. Also, when an element is referred to as being "connected to" another element, it can be directly connected to another element or be indirectly connected to another element with one or more intervening elements interposed therebetween. Hereinafter, like reference numerals refer to like elements.

Hereinafter, the exemplary embodiment will be described in detail with reference to the accompanying drawings.

FIG. 1 is a block diagram illustrating components of a flat panel display (FPD) according to an embodiment of the present invention.

In FIG. 1, an organic light emitting display is taken as an example, which is one embodiment. However, the flat panel display according to the embodiment of the present invention is not limited to an organic light emitting display.

Referring to FIG. 1, the organic light emitting display as the flat panel display according to the embodiment of the present invention includes a display panel 30 including a plurality of pixels 40 coupled to scan lines S1 to Sn and data lines D1 to Dm, a scan driver 10 for driving scan lines S1 to Sn, a data driver 20 for driving data lines D1 to Dm, and a timing controller 50 for controlling the scan driver 10 and the data driver 20.

The timing controller 50 generates driving control signals DCS and scan driving control signals SCS to correspond to the synchronizing signals supplied from the outside. The data driving control signals DCS generated by the timing controller 50 are supplied to the data driver 20, and the scan driving control signals SCS are supplied to the scan driver 10. The timing controller 50 supplies the data Data supplied from the outside to the data driver 20.

The scan driver 10 receives the scan driving control signals SCS from the timing controller 50. The scan driver 10 which receives the scan driving control signals SCS generates scan signals and sequentially supplies the generated scan signals to the scan lines S1 to Sn.

The data driver 20 receives the data driving control signals DCS from the timing controller 50. The data driver 20 which receives the data driving control signals DCS generates data signals and supplies the generated data signals to the data lines D1 to Dm in synchronization with the scan signals.

The display panel 30 receives a first power source ELVDD and a second power source ELVSS so as to supply the received first power source ELVDD and second power source ELVSS to the pixels 40. The pixels 40 which receive the first power source ELVDD and the second power source ELVSS control the current that flows from the first power source ELVDD to the second power source ELVSS via a light emitting element so as to correspond to the data signals and generate light components corresponding to the data signals.

That is, the flat panel display according to the embodiment of the present invention includes a display panel 30 for displaying an image, the scan/data drivers 10 and 20 for providing predetermined signals, that is, the scan signals and the data signals, to the pixels 40 provided in the display panel 30, and a timing controller 50 for controlling the scan/data drivers.

In this regard, the scan driver 10 and the data driver 20 are realized by a plurality of ICs and are mounted on printed circuit boards (PCBs) and/or a flexible printed circuit board (FPCB) so as to be electrically coupled to the printed circuit board on which various elements are mounted. The timing controller 50 is mounted on an additional printed circuit board. A plurality of signal lines for transmitting signals between the scan/data driver and the timing controller are formed between the printed circuit boards.

In addition, recently, as the flat panel display is enlarged, the scan driver 10 is directly mounted in the outline region, that is, the non-display region (e.g. front surface) of the display panel 30 and only the data driver 20 will be mounted on the printed circuit board or the flexible printed circuit board.

Here, the data driver 20 and the timing controller 50 are mounted on printed circuit boards, and the printed circuit boards are positioned on the back surface of the display panel.

Figure 2:
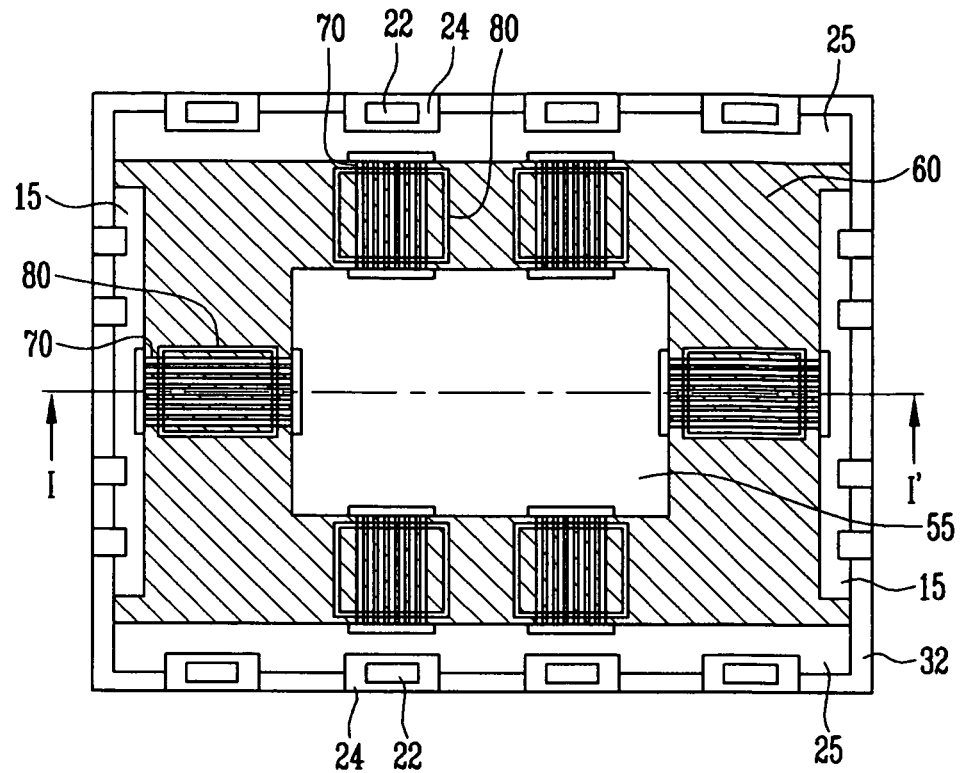
FIG. 2 is a plan view illustrating the back surface structure of a display panel of the flat panel display (FPD) according to an embodiment of the present invention.
Figure 3:
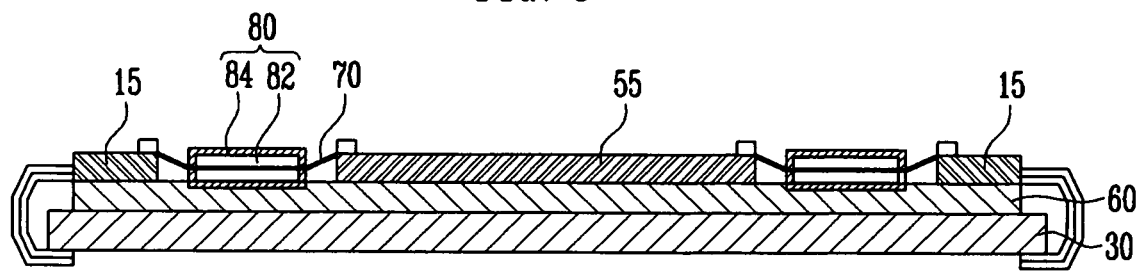
FIG. 3 is a sectional view taken along the line I-I' of the display panel of FIG. 2 according to the embodiment of the present invention.

FIGS. 2 and 3 are a plan view of the back surface structure of the display panel according to the embodiment of the present invention, and a sectional view taken along the line I-I', respectively. Referring to FIGS. 2 and 3, the following are provided: IC type scan drivers (not shown) formed on the front surface of the display panel 30 are electrically coupled to first printed circuit boards 15 mounted on the rear surface 32 of display panel 30; flexible printed circuit boards 24 in which IC type data drivers 22 are mounted on the back surface 32 of display panel 30; second printed circuit boards 25 electrically coupled to the flexible printed circuit boards 24; a third printed circuit board 55 on which the timing controller is mounted; and a plurality of signal lines 70 for transmitting and receiving signals between the scan/data drivers and the timing controller are disposed between the third printed circuit board 55 and the first and second printed circuit boards 15/25.

In the case of the flat panel display having such a structure, as described above, electromagnetic waves are generated by the printed circuit boards or the various elements mounted on the printed circuit boards, and the signals lines coupled between the printed circuit boards or the various elements of the flat panel display may be damaged by the electromagnetic waves applied from the outside.

In addition, recently, as the flat panel display is enlarged, the distance between the printed circuit boards coupled by the signal lines increases so that the length of the signal lines increases, and the flat panel display is vulnerable to external electromagnetic interference noise. When the printed circuit boards are directly attached to the back surface of the display panel, a path which can effectively disperse the heat generated by the display panel and the heat generated by the printed circuit board is not formed so that, when the flat panel display operates for a long time, the flat panel display is vulnerable to heat.

Therefore, according to the embodiment of the present invention, a conductive heat proof plate 60 is mounted between the back surface 32 of the display panel 30 and the printed circuit boards 15, 25 and 55. A blocking unit 80 having an external surface 84 made of a conductive material to be electrically coupled to the heat proof plate 60, and having an insulating layer 82, surround signal lines 70. Therefore, the electromagnetic interference noise unnecessarily generated by the flat panel display is reduced, and electromagnetic susceptibility (EMS) is reduced against external electromagnetic wave environments, so that the resistance against the electromagnetic waves of the flat panel display is enhanced, so that the resistance against electromagnetic compatibility (EMC) is improved, and so that the thermal characteristic is improved.

To be specific, referring to FIGS. 2 and 3, according to the embodiment of the present invention, the heat proof plate 60 is made of a material having high electrical and thermal conductivity, and is attached to the back surface 32 of the display panel 30.

In this regard, since the heat proof plate 60 has adhesiveness on both front and back surfaces, the front surface of heat proof plate 60 is attached to the back surface 32 of the display panel 30, and the third printed circuit boards 15, 25 and 55 are fixed to the back surface of the heat proof plate 60, without an additional adhesive tape.

As described above, the heat proof plate 60 is provided between the back surface 32 of the display panel and the first to third printed circuit boards 15, 25, and 55 so that a path which can effectively disperse the heat generated by the display panel 30 and the heat generated by the printed circuit boards is formed, and the heat proof characteristic is improved.

In addition, the heat proof plate 60 may be formed of a material having a color with high reflectance. Therefore, the reflectance of the light emitted by the display panel 30 is increased to reduce optical loss.

The plurality of signal lines 70 coupled between the third printed circuit board 55 on which the timing controller is mounted and the first and second printed circuit boards 15 and 25, respectively, are surrounded by an additional blocking unit 80 as illustrated in FIG. 3.

In this regard, as illustrated in FIG. 3, the blocking unit 80 includes the insulating layer 82 in the inside which contacts the signal lines 70, and the external surface 84 of the insulating layer is made of a conductive material.

That is, in the blocking unit 80, the insulating layer 82 is formed in the region between the signal lines 70 so that parasitic capacitance which can be formed between the signal lines 70 can be removed, and the external surface of the insulating layer 82 is made of a conductive material. Since the external surface 84 of the blocking unit having conductivity contacts the conductive heat proof plate 60 to be electrically coupled, the electromagnetic interference can be blocked. At this point, ground power source GND is applied to the heat proof plate 60.

Figure 4:
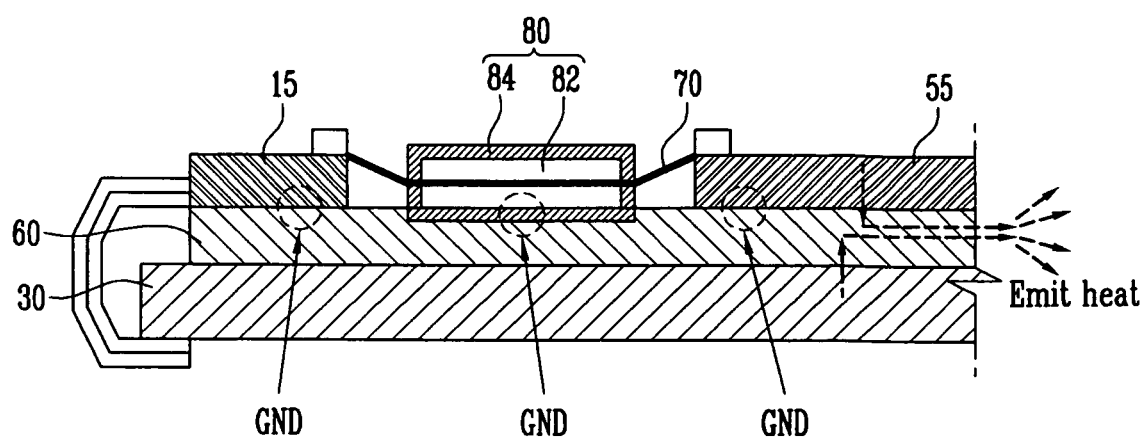
FIG. 4 is a view illustrating the characteristic of the structure of the flat panel display according to the embodiment of the present invention.

FIG. 4 is a view illustrating the characteristic of the structure of the flat panel display according to the embodiment of the present invention.

Referring to FIG. 4, the first an third printed circuit boards 15 and 55 are attached to the heat proof plate 60 coupled to a ground power source (not shown) to be electrically coupled so that a large ground region GND can be secured and which the resistance against the electromagnetic interference noise can be improved.

In addition, since the blocking unit 80 surrounding the signal lines 70 and the external surface 84 is made of a conductive material, the signal lines 70 contact the heat proof plate 60 so that the blocking effect of the signal lines against noise can be improved.

Heat is mainly generated by the display panel 30 and printed circuit boards, in particular, the third printed circuit board 55 on which the timing controller is mounted. The generated heat contacts the air over a large area by the heat proof plate 60 having high thermal conductivity to emit heat. Therefore, a rise in the temperature of the display panel 30 is reduced and the electric characteristic of the driver and the timing controller can be normally maintained.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:
1. A flat panel display, comprising:
   a display panel including a plurality of pixels to display an image;
   a scan driver and a data driver providing scan signals and data signals, respectively, to the pixels included in the display panel;
   a timing controller applying predetermined control signals to the scan driver and the data driver;
   a first printed circuit board and a second printed circuit board electrically coupled to the scan driver and the data driver, respectively;
   a third printed circuit board on which the timing controller is mounted;
   a plurality of signal lines disposed between the third printed circuit board and the first and second printed circuit boards, the plurality of signal lines transmitting signals between the timing controller and the scan and data drivers;
   a heat proof plate inserted between a back surface of the display panel and the first, second and third printed circuit boards; and
   a blocking unit formed to surround the plurality of signal lines, the blocking unit protecting the signal lines from noise, the blocking unit being formed of an insulating layer formed in a region which contacts the signal lines and a conductive material which surrounds an external surface of the insulating layer, wherein an entire first surface of the conductive material is electrically coupled to the heat proof plate by direct contact, wherein a ground power source is applied to the heat proof plate.

2. The flat panel display as claimed in claim 1, the scan driver and the data driver being formed of a plurality of integrated circuits.

3. The flat panel display as claimed in claim 2, the plurality of integrated circuits which constitute the scan driver being formed on an outline front surface of the display panel.

4. The flat panel display as claimed in claim 2, the plurality of integrated circuits which constitute the data driver being mounted on flexible printed circuit boards, the flexible printed circuit boards being coupled to the second printed circuit board.

5. The flat panel display as claimed in claim 1, the heat proof plate being made of a material having high electrical conductivity and high thermal conductivity.

6. The flat panel display as claimed in claim 1, an external surface of the heat proof plate being made of an adhesive material.

7. The flat panel display as claimed in claim 1, the heat proof plate being made of a material having a color with high reflectance.

8. A flat panel display, comprising:
a display panel including a plurality of pixels to display an image;
a heat proof plate adhesively mounted to a back surface of the display panel;
first, second and third printed circuit boards mounted to a back surface of the heat proof plate;
a scan driver electrically coupled to the first printed circuit board;
a data driver electrically coupled to the second printed circuit board, the scan and data drivers providing scan signals and data signals, respectively, to the pixels included in the display panel;
a timing controller mounted on the third printed circuit board, the timing controller applying predetermined control signals to the scan driver and the data driver;
a plurality of signal lines disposed between the third printed circuit board and the first and second printed circuit boards, the plurality of signal lines transmitting signals between the timing controller and the scan and data drivers; and
a blocking unit formed to surround the plurality of signal lines, the blocking unit being electrically coupled to the heat proof plate by direct contact, the blocking unit protecting the signal lines from noise, the blocking unit being formed of an insulating layer formed in a region which contacts the signal lines and a conductive material which surrounds an external surface of the insulating layer,
wherein an entire first surface of the conductive material is electrically coupled to the heat proof plate by direct contact, wherein a ground power source is applied to the heat proof plate.

9. The flat panel display as claimed in claim 8, the scan driver and the data driver being formed of a plurality of integrated circuits.

10. The flat panel display as claimed in claim 9, the plurality of integrated circuits which constitute the scan driver being formed on an outline front surface of the display panel.

11. The flat panel display as claimed in claim 9, the plurality of integrated circuits which constitute the data driver being mounted on flexible printed circuit boards, the flexible printed circuit boards being coupled to the second printed circuit board.

12. The flat panel display as claimed in claim 8, the heat proof plate being made of a material having high electrical conductivity and high thermal conductivity.

13. The flat panel display as claimed in claim 8, an external surface of the heat proof plate being made of an adhesive material.

14. The flat panel display as claimed in claim 8, the heat proof plate being made of a material having a color with high reflectance.

15. A flat panel display having a display panel including a plurality of pixels to display an image, a scan driver and a data driver providing scan signals and data signals, respectively, to the pixels included in the display panel, a timing controller applying predetermined control signals to the scan driver and the data driver, a first printed circuit board and a second printed circuit board electrically coupled to the scan driver and the data driver, respectively; a third printed circuit board on which the timing controller is mounted, and a plurality of signal lines disposed between the third printed circuit board and the first and second printed circuit boards, the plurality of signal lines transmitting signals between the timing controller and the scan and data drivers, the flat panel display, comprising:
a heat proof plate inserted between a back surface of the display panel and the first, second and third printed circuit boards, a ground power source being applied to the heat proof plate; and
a blocking unit having four sides formed to surround the plurality of signal lines, the blocking unit protecting the signal lines from noise, the blocking unit including:
an insulating layer in surrounding contact with the signal lines; and
a conductive material in surrounding contact with an external surface of the insulating layer and forming the four sides of the blocking unit, an entire surface of one of the four sides of the conductive material being electrically coupled to the heat proof plate by direct contact.

16. The flat panel display as claimed in claim 15, the heat proof plate being made of a material having high electrical conductivity and high thermal conductivity.

17. The flat panel display as claimed in claim 15, an external surface of the heat proof plate being made of an adhesive material.

18. The flat panel display as claimed in claim 15, the heat proof plate being made of a material having a color with high reflectance.

* * * * *